US010826509B2

(12) United States Patent
Tanaka

(10) Patent No.: US 10,826,509 B2
(45) Date of Patent: Nov. 3, 2020

(54) METHOD OF CONTROLLING ATOMIC OSCILLATOR, ATOMIC OSCILLATOR, AND FREQUENCY SIGNAL GENERATION SYSTEM

(71) Applicant: Seiko Epson Corporation, Tokyo (JP)

(72) Inventor: Noriaki Tanaka, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 16/444,066

(22) Filed: Jun. 18, 2019

(65) Prior Publication Data

US 2019/0386668 A1    Dec. 19, 2019

(30) Foreign Application Priority Data

Jun. 19, 2018    (JP) .................................. 2018-116037

(51) Int. Cl.
  *H03L 7/26*    (2006.01)
  *G04F 5/14*    (2006.01)
(52) U.S. Cl.
  CPC ................ *H03L 7/26* (2013.01); *G04F 5/145* (2013.01)
(58) Field of Classification Search
  CPC ... H03L 7/26; G04F 5/145; G04F 5/14; H03B 17/00
  See application file for complete search history.

(56) References Cited

U.S. PATENT DOCUMENTS

| 9,048,853 B2 * | 6/2015 | Chindo ................... G04F 5/145 |
| 2002/0125959 A1 | 9/2002 | Atsumi et al. |
| 2015/0091660 A1 | 4/2015 | Tanaka et al. |

FOREIGN PATENT DOCUMENTS

| JP | H02-260920 A | 10/1990 |
| JP | 2000-209087 A | 7/2000 |
| JP | 2002-271197 A | 9/2002 |
| JP | 2008-131122 A | 6/2008 |
| JP | 2015-070416 A | 4/2015 |

* cited by examiner

*Primary Examiner* — Ryan Johnson
(74) *Attorney, Agent, or Firm* — Harness, Dickey & Pierce, P.L.C.

(57) ABSTRACT

A method of controlling an atomic oscillator includes irradiating an atom cell containing an alkali metal atom with light, measuring a temperature of the atom cell, sweeping a center wavelength of the light when a change amount of the temperature per unit time is equal to or less than a specified value, measuring an intensity of light passing through the atom cell, and determining the center wavelength of the light used for generating a frequency signal based on the intensity of the light.

6 Claims, 8 Drawing Sheets

METHOD OF CONTROLLING ATOMIC OSCILLATOR, ATOMIC OSCILLATOR, AND FREQUENCY SIGNAL GENERATION SYSTEM

The present application is based on, and claims priority from, JP Application Serial Number 2018-116037, filed Jun. 19, 2018, the disclosure of which is hereby incorporated by reference herein in its entirety.

BACKGROUND

1. Technical Field

The present disclosure relates to a method of controlling an atomic oscillator, an atomic oscillator, and a frequency signal generation system.

2. Related Art

An atomic oscillator which oscillates based on energy transition of an atom of an alkali metal such as rubidium, cesium, or the like is known as an oscillator having long-term high-precision oscillation characteristics. See, for example, JP-A-2015-70416.

In general, an operating principle of the atomic oscillator is broadly divided into a method using double resonance phenomenon by light and microwave and a method using coherent population trapping (CPT) by two kinds of light of different wavelengths, but the atomic oscillator using the CPT can be downsized more than the atomic oscillator using the double resonance phenomenon, so the atomic oscillator is expected to be installed in various devices in recent years.

In the atomic oscillator described in JP-A-2015-70416, an oscillation frequency is locked during driving. When the oscillation frequency is unlocked, the oscillation frequency is swept, and the oscillation frequency is locked again. Further, in the lock, the lock is made to an absorption line. The absorption line is, for example, a central absorption line having the largest peak out of the five absorption lines showing a relationship between a light absorption amount and a wavelength in a gas cell.

However, if the five absorption lines are detected when a change of a temperature of outside air is large, it is sometimes impossible to correctly detect five absorption lines. For example, an absorption amount of one absorption line different from another absorption line which is to be maximized if the temperature of the outside air is constant and which should be selected, may be maximized by an influence of the temperature change. Accordingly, the different absorption line may be erroneously selected. As a result of erroneously selecting the absorption line, an electromagnetically induced transparency (EIT) signal deviates from a desired value and accuracy of the frequency of the atomic oscillator decreases. The present inventor discovered such a new problem.

SUMMARY

An advantage of some aspects of the present disclosure is to solve at least a part of the problems described above, and the present disclosure can be implemented as the following application examples.

A method of controlling an atomic oscillator according to an application example includes: irradiating an atom cell containing an alkali metal atom with light, measuring a temperature of the atom cell, sweeping a center wavelength of the light when a change amount of the temperature per unit time is equal to or less than a specified value, measuring an intensity of light passing through the atom cell, and determining the center wavelength of the light used for generating a frequency signal based on the intensity of the light.

In the method of controlling an atomic oscillator according to the application example, the sweeping may be performed when the change amount of the temperature is equal to or less than the specified value and the temperature is equal to or less than a specified temperature.

In the method of controlling an atomic oscillator according to the application example, the sweeping may be stopped when the temperature rises to exceed a first temperature, and the sweeping may be started when the temperature decreases to be equal to or less than a second temperature lower than the first temperature.

In the method of controlling an atomic oscillator according to the application example, the sweeping may be stopped when the change amount of the temperature is larger than the specified value.

An atomic oscillator according to an application example includes: an atom cell containing an alkali metal atom, a light emitting element irradiating the atom cell with light, a photodetector element measuring an intensity of light transmitted through the atom cell, a temperature sensor measuring a temperature of the atom cell, a circuit generating a current for controlling the light emitting element based on the intensity of the light, and a processing unit causing the circuit to change the current thereby sweeping a center wavelength of the light when a change amount of the temperature per unit time is equal to or less than a specified value, where the processing unit determines the center wavelength of the light used for generating a frequency signal based on the intensity of the light.

A frequency signal generation system according to an application example includes: an atomic oscillator including an atom cell containing an alkali metal atom, a light emitting element irradiating the atom cell with light, a photodetector element measuring an intensity of light transmitted through the atom cell, a temperature sensor measuring a temperature of the atom cell, a circuit generating a current for controlling the light emitting element based on the intensity of the light, and a processing unit causing the circuit to change the current thereby sweeping a center wavelength of the light when a change amount of the temperature per unit time is equal to or less than a specified value, the processing unit determining the center wavelength of the light used for generating a frequency signal based on the intensity of the light; and a signal processing unit processing a signal from the atomic oscillator.

DESCRIPTION OF EXEMPLARY EMBODIMENTS

Hereinafter, a method of controlling an atomic oscillator, an atomic oscillator, and a frequency signal generation system according to the present disclosure will be described in detail based on a preferred embodiment illustrated in the accompanying drawings.

Figure 1:
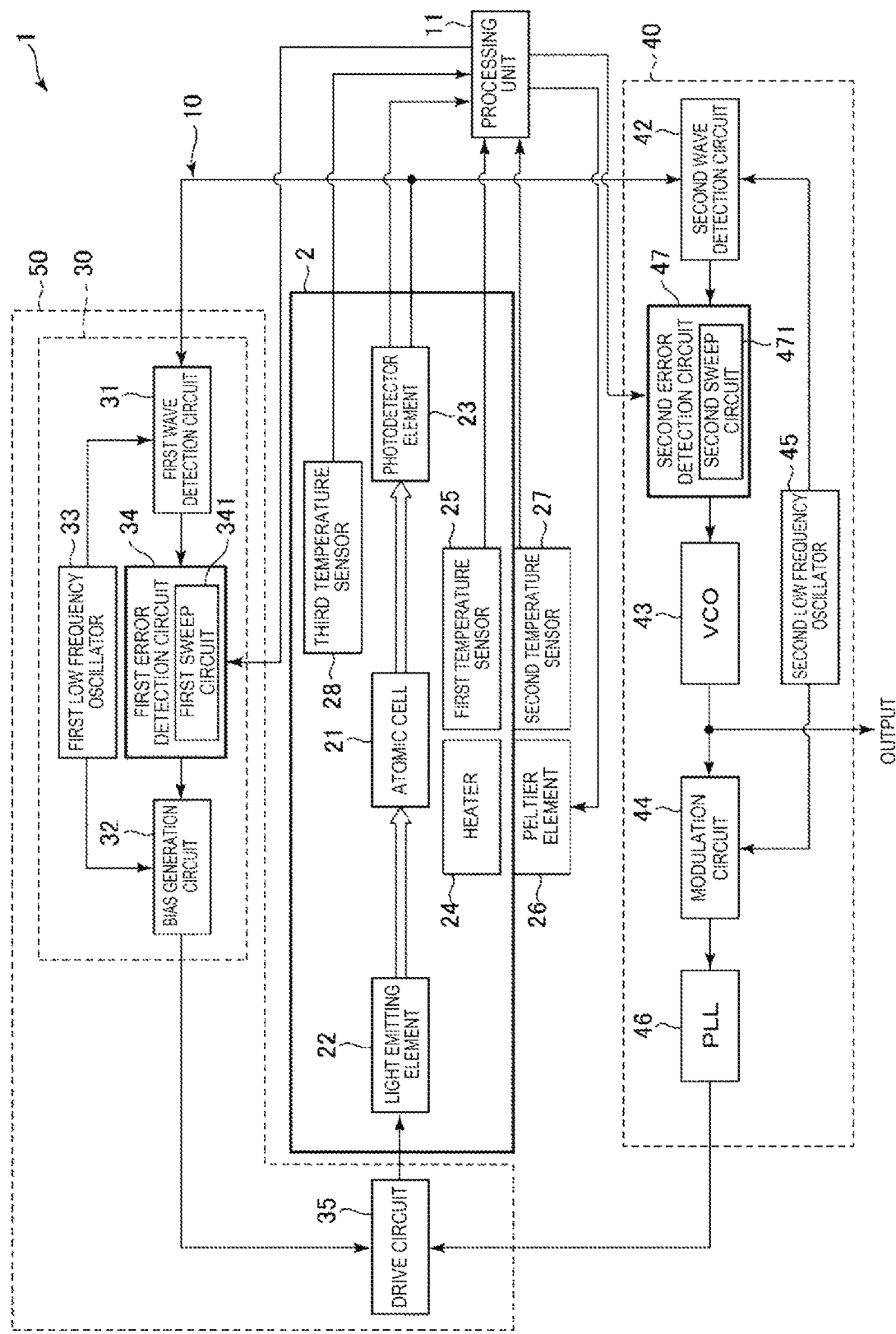
FIG. 1 is a block diagram illustrating a schematic configuration of an atomic oscillator according to an embodiment.
Figure 2:
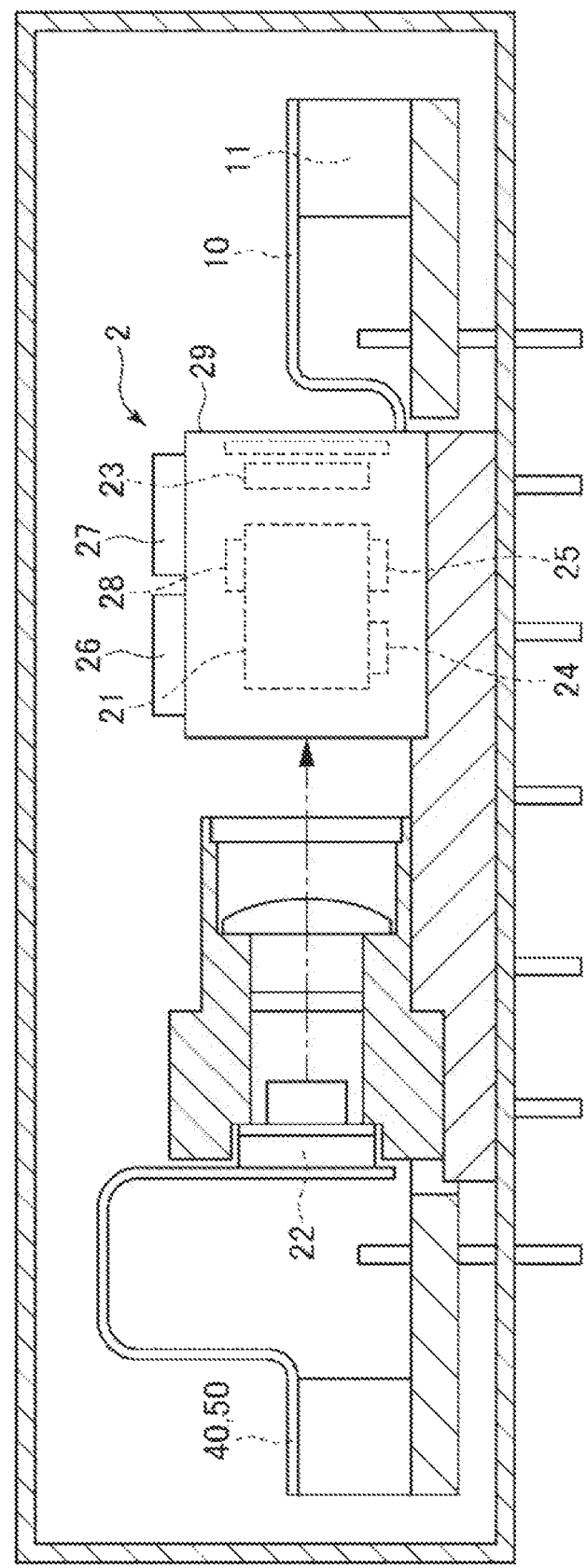
FIG. 2 is a sectional side view of the atomic oscillator according to the embodiment.
Figure 3:
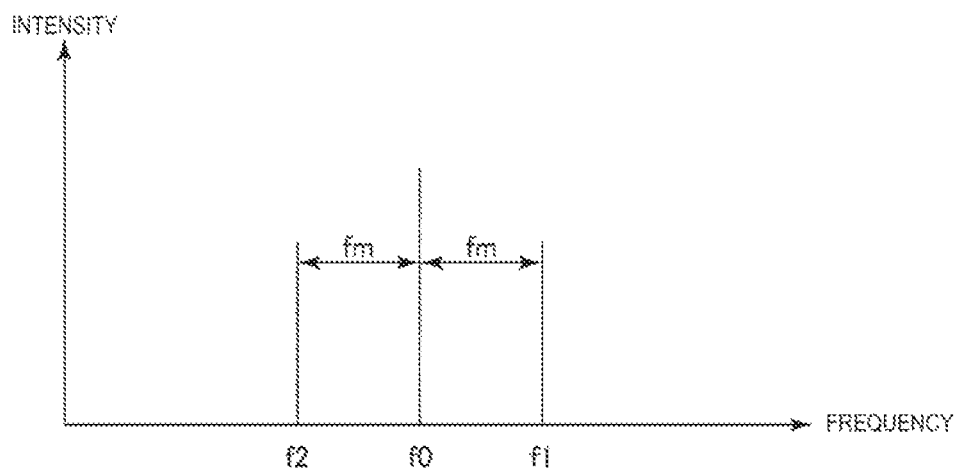
FIG. 3 is a diagram schematically illustrating a frequency spectrum of light emitted from a light emitting element.
Figure 4:
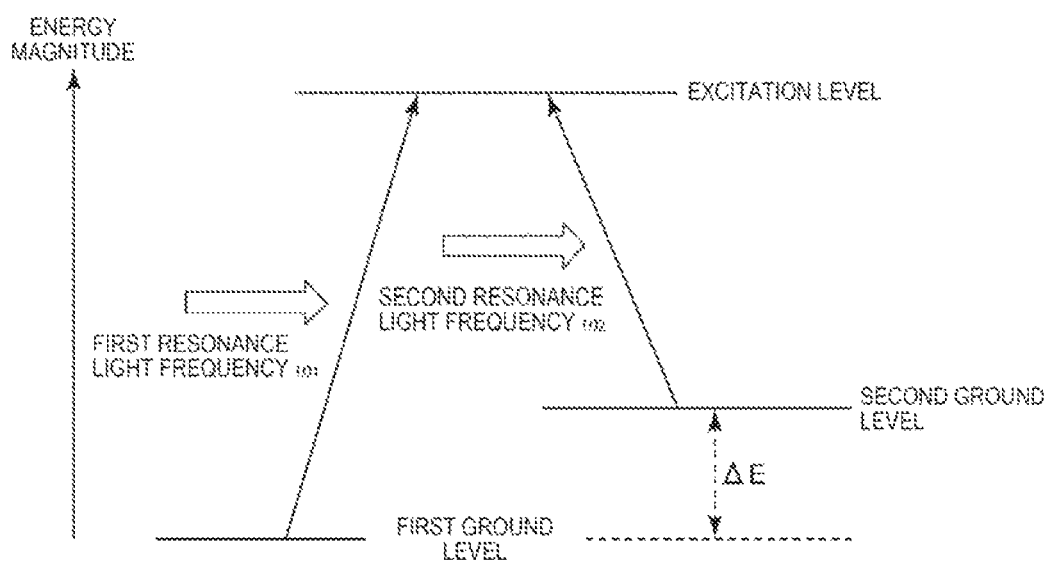
FIG. 4 is a diagram for explaining an energy state of an alkali metal atom.
Figure 5:
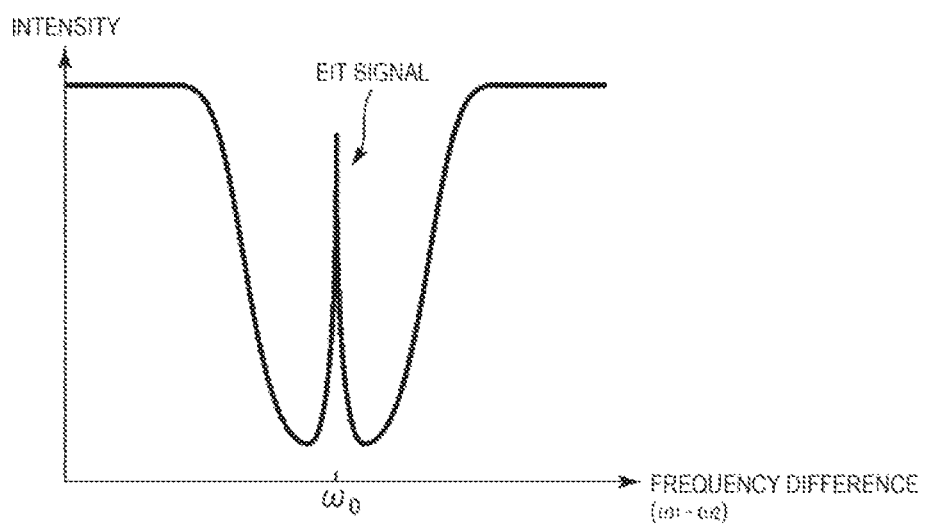
FIG. 5 is a graph illustrating a relationship between a frequency difference between two lights emitted from a light emitting element of the atomic oscillator, and an intensity of light measured by a photodetector element.
Figure 6:
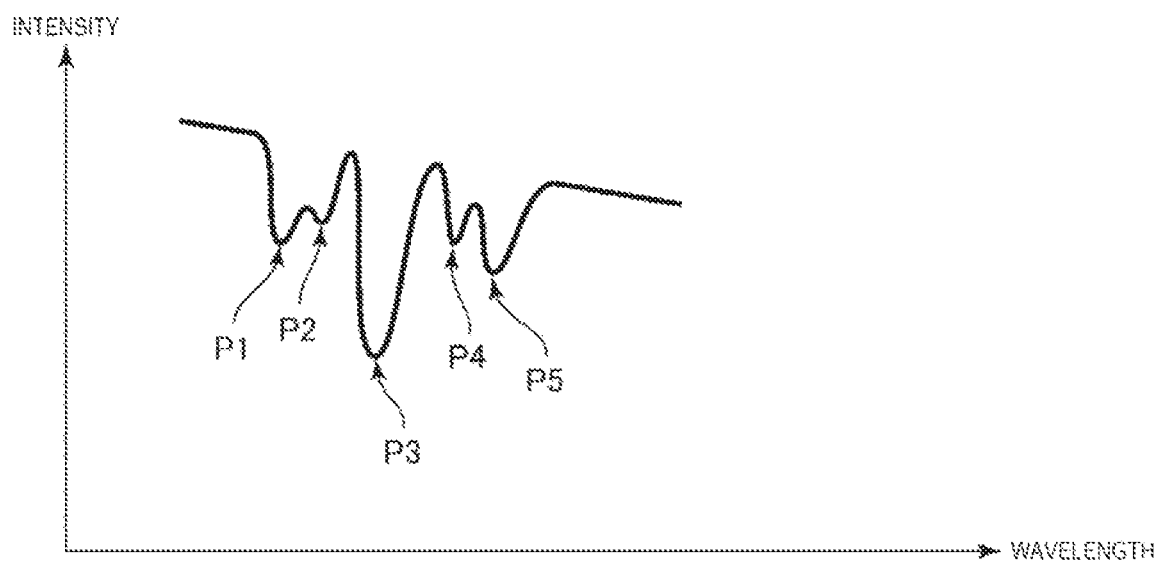
FIG. 6 is a graph illustrating an example of a relationship between a wavelength of light passing through an atom cell of the atomic oscillator and the intensity of the light measured by the photodetector element.
Figure 7:
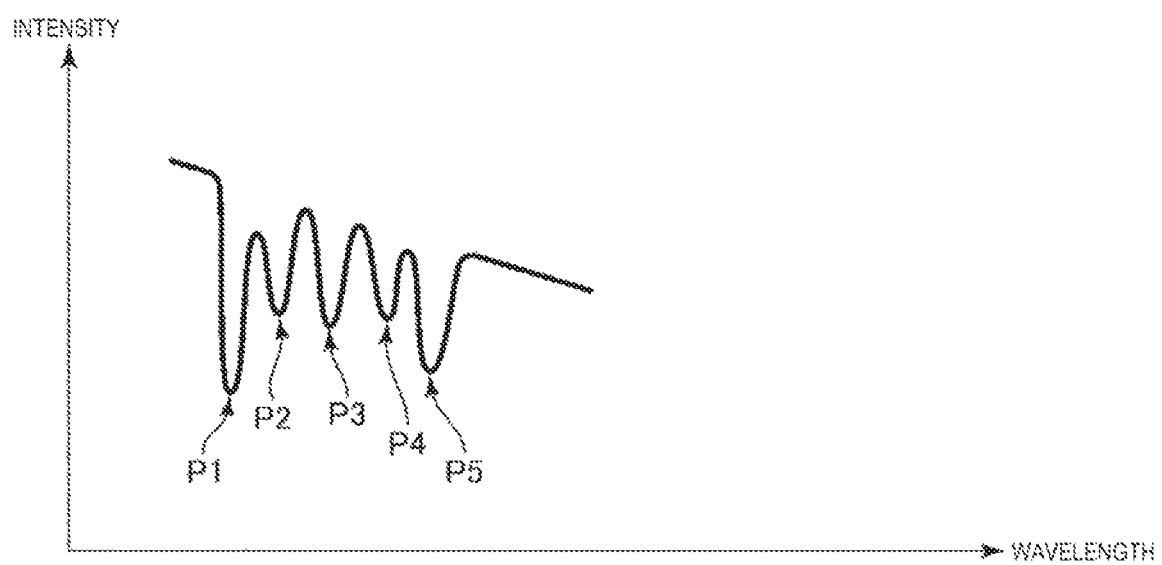
FIG. 7 is a graph illustrating an example of a relationship between the wavelength of the light passing through the atom cell of the atomic oscillator and the intensity of the light measured by the photodetector element.
Figure 8:
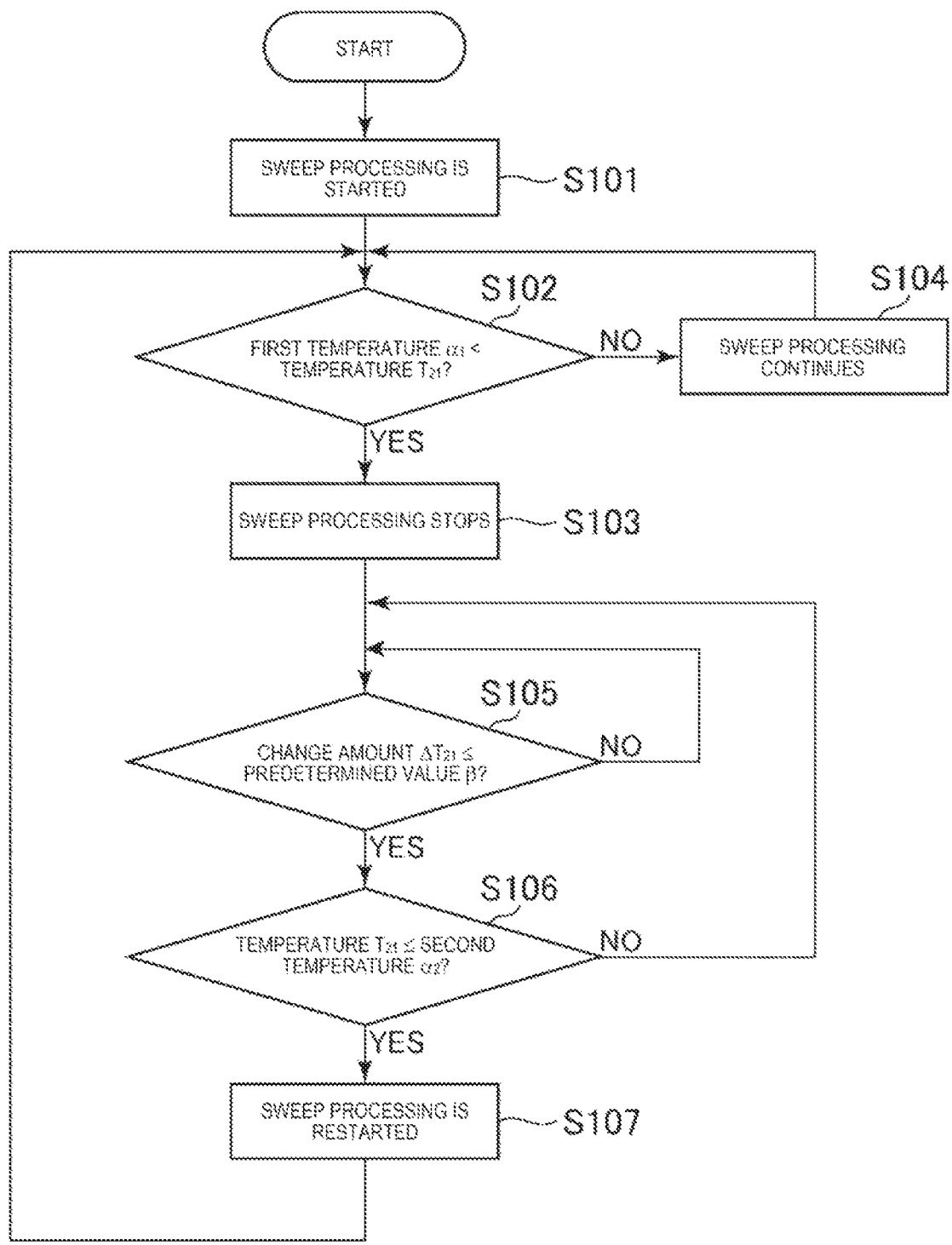
FIG. 8 is a flowchart illustrating a control flow of the atomic oscillator.
Figure 9:
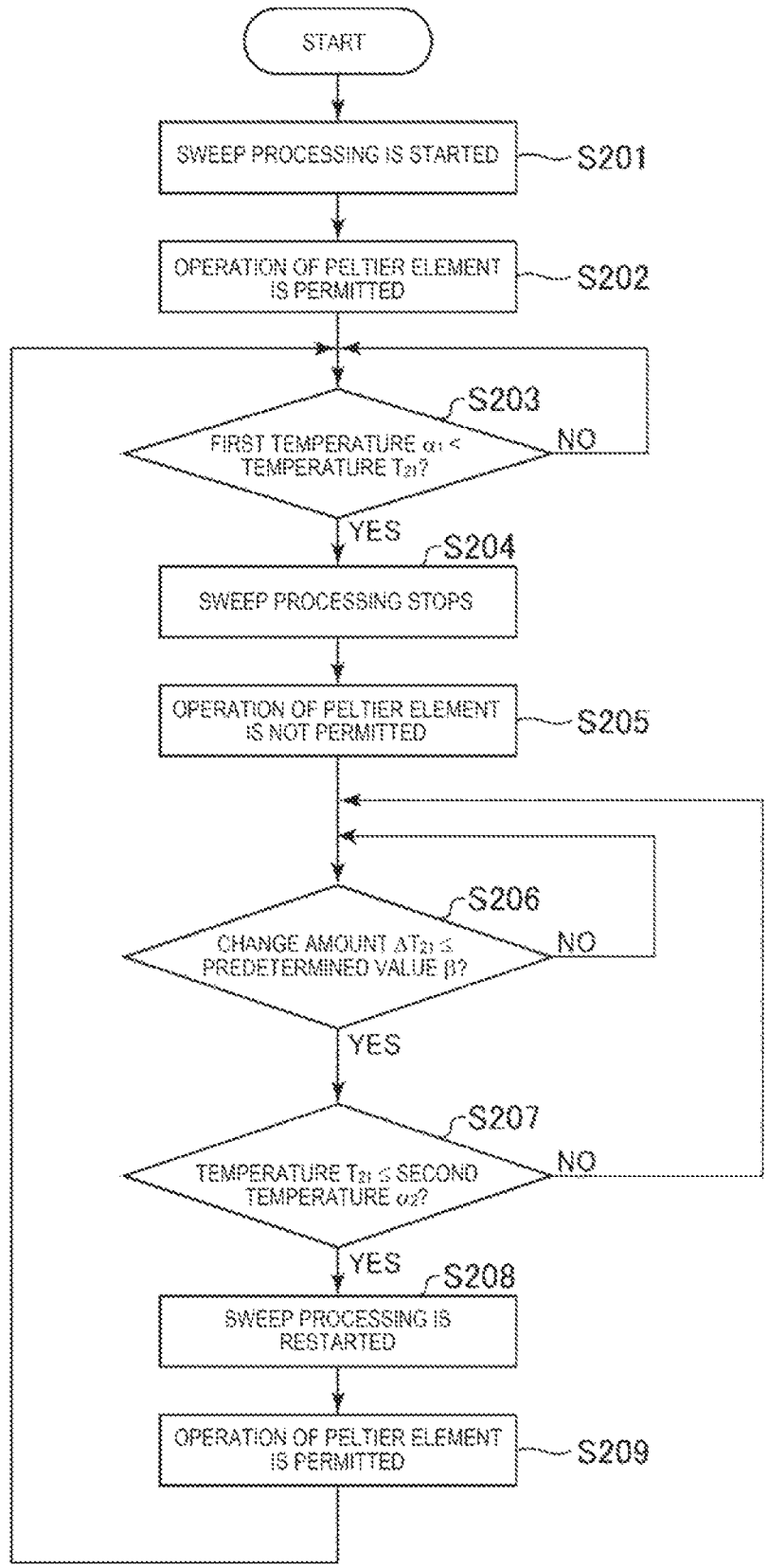
FIG. 9 is a flowchart illustrating a control flow of the atomic oscillator.

FIG. 1 is a block diagram illustrating a schematic configuration of an atomic oscillator according to an embodiment. FIG. 2 is a sectional side view of the atomic oscillator according to the embodiment. FIG. 3 is a diagram schematically illustrating a frequency spectrum of light emitted from a light emitting element. FIG. 4 is a diagram for explaining an energy state of an alkali metal atom. FIG. 5 is a graph illustrating a relationship between a frequency difference between two lights emitted from a light emitting element of the atomic oscillator, and an intensity of light measured by a photodetector element. FIG. 6 is a graph illustrating an example of a relationship between a wavelength of light passing through an atom cell of the atomic oscillator and the intensity of the light measured by the photodetector element. FIG. 7 is a graph illustrating an example of a relationship between the wavelength of the light passing through the atom cell of the atomic oscillator and the intensity of the light measured by the photodetector element. FIG. 8 is a flowchart illustrating a control flow of atomic oscillator. FIG. 9 is a flowchart illustrating a control flow of atomic oscillator. Further, the graphs illustrated in FIGS. 6 and 7 are merely examples, respectively, and are drawn exaggeratedly for ease of explanation.

A method of controlling an atomic oscillator 1 includes irradiating an atom cell 21 containing the alkali metal atom with light, measuring a temperature of the atom cell 21 and measuring a change amount of a temperature per unit time, sweeping a central wavelength of the light when the change amount of the temperature per unit time is equal to or lower than a specified value, measuring an intensity of the light passing through the atom cell 21, and determining the center wavelength of the light to be used in generating the frequency signal based on the intensity of the light.

Further, the atomic oscillator 1 is constituted to be able to perform the control method. The atomic oscillator 1 includes the atom cell 21 containing the alkali metal atom, a light emitting element 22 irradiating the atom cell 21 with the light, a photodetector element 23 measuring the intensity of the light transmitted through the atom cell 21, a third temperature sensor 28 as a temperature sensor measuring the temperature of the atom cell 21, a current generation circuit 50 as a circuit generating a current for controlling the light emitting element 22 based on the intensity of light, and a processing unit 11 sweeping the center wavelength of the light by changing the current supplied from the current generation circuit 50 to the light emitting element 22 when the change amount of the temperature per unit time is equal to or less than a specified value. The processing unit 11 can determine the center wavelength of the light used for generating the frequency signal based on the intensity of the light.

Generally, although it depends on a temperature of outside air and degree of a temperature change of outside air in an environment where the atomic oscillator is used, accuracy of a frequency of the atomic oscillator tends to decrease due to the temperature of the outside air and the temperature change of the outside air.

Therefore, although it will be described in detail later, to briefly describe here, in the method of controlling the atomic oscillator 1 and the atomic oscillator 1, sweeping is performed for the center wavelength of the light when the change amount of the temperature of the atom cell 21 per unit time is equal to or lower than the specified value. By sweeping when the temperature change is small, it is possible to reduce the decrease in the accuracy of the frequency of the atomic oscillator 1 due to the temperature change of the outside air in the atomic oscillator 1. Further, an influence of large temperature change on the sweeping will be described later. "Locking" means that a bias current is controlled and stabilized as described later.

The atomic oscillator 1 shown in FIG. 1 is the atomic oscillator using the CPT in which a phenomenon occurs where two resonance lights are transmitted without being absorbed by the alkali metal atom when the alkali metal atom is irradiated simultaneously with two resonance lights having specific wavelengths different from each other. Further, the phenomenon caused by the CPT is also referred to as an electromagnetically induced transparency (EIT) phenomenon.

As shown in FIG. 1, the atomic oscillator 1 has a physical package 2 and a control circuit 10 electrically coupled to the physical package 2.

As shown in FIG. 2, the physical package 2 includes the light emitting element 22 emitting the light, the atom cell 21 in which an alkali metal atom such as a rubidium atom or a cesium atom is encapsulated, the photodetector element 23, a heater 24 as a heating unit heating the atom cell 21, and a first temperature sensor 25 measuring the temperature of the atom cell 21.

Further, the physical package 2 includes a shield 29 housing the atom cell 21, the photodetector element 23, the heater 24, and the first temperature sensor 25.

The physical package 2 has a Peltier element 26 cooling the shield 29 from an outside and a second temperature sensor 27 measuring a temperature near an outer surface of the shield 29. The Peltier element 26 and the second temperature sensor 27 are disposed outside the shield 29.

In addition, the physical package 2 also includes the third temperature sensor 28 housed in the shield 29 together with the first temperature sensor 25.

As shown in FIG. 1, the control circuit 10 includes a first wave detection circuit 31, a bias generation circuit 32, a first low frequency oscillator 33, a first error detection circuit 34, a drive circuit 35, a second wave detection circuit 42, a voltage controlled oscillator (VCO) 43, a modulation circuit 44, a second low frequency oscillator 45, a phase locked loop (PLL) 46, a second error detection circuit 47, and the processing unit 11.

Here, the drive circuit 35 supplies a drive current obtained by superimposing a modulation current on the bias current, to the light emitting element 22. Thus, as shown in FIG. 3, the light emitting element 22 emits light including a light of a center frequency $f_0$ with respect to a current value of the bias current, and two sideband lights of frequencies f1 and f2 which are shifted by a frequency fm of the modulation current on both sides with respect to the center frequency $f_0$. The light passes through the atom cell 21 and is measured by the photodetector element 23. The first wave detection circuit 31, the bias generation circuit 32, the first low frequency oscillator 33, and the first error detection circuit 34 function as a bias current adjustment unit 30 which adjusts the current value of the bias current of the drive circuit 35 based on a detection result of the photodetector element 23, in other words, based on the intensity of the light measured by the photodetector element 23. Further, the bias current adjustment unit 30 and the drive circuit 35 function as the current generation circuit 50 which generates the current for controlling the light emitting element 22 based on the detection result of the photodetector element 23.

Further, the second wave detection circuit 42, the voltage controlled oscillator 43, the modulation circuit 44, the second low frequency oscillator 45, the PLL 46, and the second error detection circuit 47 function as a signal generator 40 generating a microwave signal with respect to a transition frequency between two ground levels of the alkali metal atom in the atom cell 21 based on the detection result of the photodetector element 23. The signal generator 40 adjusts the frequency of the microwave signal used as the modulation current so that the EIT phenomenon caused by the two sideband lights described above and the alkali metal atom in the atom cell 21 occurs, and stabilizes an output signal of the voltage controlled oscillator 43 at a specified frequency, outputting the output signal as a clock signal of atomic oscillator 1.

Each unit of the atomic oscillator 1 will be sequentially described below.

As described above, the physical package 2 shown in FIG. 1 includes the light emitting element 22, the atom cell 21, the photodetector element 23, the heater 24, the first temperature sensor 25, the Peltier element 26, the second temperature sensor 27, and the third temperature sensor 28.

The light emitting element 22 irradiates the atom cell 21 with the light. Specifically, the light emitting element 22 has a function of receiving the supply of the drive current obtained by superimposing the modulation current on the bias current and emitting the two sideband lights mentioned above as a first light and a second light having different frequencies from each other. The light emitting element 22 may be a light source having the above-described function, and may be, but not particularly limited to, for example, a semiconductor laser such as a vertical cavity surface emitting laser (VCSEL). The semiconductor laser can emit two types of lights having different wavelengths by superimposing a high frequency signal on a DC bias current. In the present embodiment, the light emitting from the light emitting element 22 is linearly polarized.

Constitution of the atom cell 21 may include, but not particularly limited to, for example, a trunk portion having a through hole and a window portion joined to the trunk portion so as to cover the through hole from both sides. A material constituting the trunk portion may be, but not particularly limited to, a metal material, a resin material, a glass material, a silicon material, a quartz crystal, or the like, but from viewpoints of processability and bonding with the window portion, it is preferable that the glass material and the silicon material are used. Further, the material constituting the window portion may be, but not particularly limited to, for example, the silicon material, the glass material, the quartz crystal, or the like as long as the material has optical transparency.

Further, the gaseous alkali metal atom such as rubidium, cesium, and sodium is enclosed in space surrounded by the trunk portion and the window portion, that is, within the atom cell 21. Further, in the atom cell 21, a rare gas such as argon or an inert gas such as nitrogen may be encapsulated as a buffer gas together with the gaseous alkali metal atom, if necessary.

As shown in FIG. 4, the alkali metal atom has energy levels in a three-level system including two different ground levels, specifically, a first ground level and a second ground level, and an excitation level. The first ground level is an energy level lower than the second ground level. Here, light absorption occurs when each of a first resonance light having a frequency $\omega_1$ corresponding to an energy difference between the first ground level and the excitation level, and a second resonance light having a frequency $\omega_2$ corresponding to an energy difference between the second ground level and the excitation level, is used to individually irradiate the alkali metal atom. On the contrary, when the first resonance light and the second resonance light are used for irradiation at the same time, an electromagnetically induced transmission phenomenon occurs in which both the first resonance light and the second resonance light are transmitted without being absorbed by the alkali metal atom.

The electromagnetically induced transmission phenomenon occurs when the alkali metal atom is simultaneously irradiated with the first resonance light and the second resonance light and a frequency difference $(\omega_1-\omega_2)$ between the frequency $\omega_1$ of the first resonance light and the frequency $\omega_2$ of the second resonance light coincides with a frequency $\omega_0$ corresponding to an energy difference $\Delta E$ between the first ground level and the second ground level. Therefore, in accordance with the frequency difference $(\omega_1-\omega_2)$, light absorption rates of the first resonance light and the second resonance light at the alkali metal atoms change, the electromagnetically induced transmission phenomenon occurs when the frequency difference $(\omega_1-\omega_2)$ coincides with the frequency $\omega_0$, and as shown in FIG. 5, an intensity of the first resonance light and the second resonance light transmitted through the alkali metal atom steeply increases. A steep signal generated from accompanying the electromagnetically induced transmission phenomenon is called an EIT signal. The EIT signal has an eigenvalue determined by a type of the alkali metal atom. Therefore, by using such an EIT signal as a reference, a highly accurate oscillator can be constituted.

For example, when the alkali metal atom is a cesium atom, since the frequency $\omega_0$ corresponding to the energy difference $\Delta E$ is 9.1926 GHz, the EIT signal is detected when the cesium atom is irradiated at the same time with two types of lights having a frequency difference $(\omega_1-\omega_2)$ of 9.1926 GHz.

Further, in the physical package 2, optical components such as a wavelength plate, a neutral density filter, a lens, and a polarizing plate may be disposed between the light emitting element 22 and the atom cell 21. The atomic oscillator 1 of the present embodiment includes the wavelength plate, the neutral density filter, and the lens, and the light incident on the atom cell 21 is circularly polarized by passing through the wavelength plate.

The photodetector element 23 measures the intensity of the light transmitted through the atom cell 21. Specifically, the photodetector element 23 has a function of receiving and measuring the light transmitted through the atom cell 21 and outputting a detection signal corresponding to the intensity of the measured light. The photodetector element 23 may be, but not particularly limited to, for example, a light receiving element such as a photodiode as long as the photodetector element 23 measures the intensity of the light as described above.

The heater 24 has a function of heating an atom cell 21, more specifically the alkali metal atom in the atom cell 21. Thus, it is possible to maintain a gas of the alkali metal atom in the atom cell 21 at a desired concentration. The heater 24 is driven by supply of electric power, that is, generates heat by electric conduction, and for example, it is preferable that the heater 24 is provided in contact with an outer surface of the atom cell 21. Further, the heater 24 may not be in contact with the atom cell 21 as long as the heater 24 can heat the atom cell 21. The heater 24 may be, but not particularly limited to, for example, various heaters, a Peltier element, or the like having a heating resistor.

The first temperature sensor 25 is a temperature sensor for measuring the temperature of the atom cell 21. Based on a measurement result of the first temperature sensor 25, a heating amount of the heater 24 is controlled. Thus, it is possible to maintain the alkali metal atom in the atom cell 21 at a desired temperature. Further, an installation position of the first temperature sensor 25 may be, but not particularly limited to, for example, on the heater 24 or on the outer surface of the atom cell 21 if the temperature of the atom cell 21 controlled by the heater 24 can be measured at the installation position. As for the first temperature sensor 25, it is possible to use, but not particularly limited to, for example, various known temperature sensors such as a thermistor and a thermocouple.

The Peltier element 26 has a function of cooling the physical package 2. Thus, when the atom cell 21 is excessively heated by the heater 24, for example, the physical package 2 is cooled to a specified temperature and the temperature thereof is adjusted. A temperature adjustment element for adjusting the temperature of the physical package 2 is not limited to the Peltier element 26.

The second temperature sensor 27 measures the temperature near the outer surface of the shield 29. Driving of the Peltier element 26 is controlled based on a measurement result of the second temperature sensor 27. Thus, it is possible to maintain the physical package 2 at the desired temperature. Further, it is preferable that an installation position of the second temperature sensor 27 is, but not particularly limited to, for example, on the outer surface of the shield 29. As for the second temperature sensor 27, it is possible to use, but not particularly limited to, for example, various well-known temperature sensors such as a thermistor and a thermocouple, similarly to the first temperature sensor 25. The second temperature sensor 27 is electrically coupled to the processing unit 11. Thus, the measurement result at the second temperature sensor 27, that is, information on the temperature near the outer surface of the shield 29 is input to the processing unit 11.

The third temperature sensor 28 is a temperature sensor measuring the temperature of the atom cell 21. The third temperature sensor 28 is used for control of a first sweep processing to be described later and control of the Peltier element 26. The third temperature sensor 28 measures a temperature state of the atom cell 21 mainly due to the temperature of the outside air of the atomic oscillator 1 by measuring the temperature of the atom cell 21. Therefore, as shown in FIG. 2, it is preferable that the third temperature sensor 28 is disposed at a position in which the third temperature sensor 28 is less likely to receive an influence of temperature control by the heater 24 and the Peltier element 26 than the first temperature sensor 25 and the second temperature sensor 27 do. For example, it is preferable that the third temperature sensor 28 is disposed on a side opposite to the first temperature sensor 25 through the atom cell 21. In FIG. 2, the first temperature sensor 25, the second temperature sensor 27, and the third temperature sensor 28 are shown to be all disposed along a same axis for the sake of simplicity of illustration, but it is preferable that the axis on which the first temperature sensor 25 and the third temperature sensor 28 are disposed is crossed with axes on which the second temperature sensor 27 and the first temperature sensor 25 or the second temperature sensor 27 and the third temperature sensor 28 are disposed. By disposing in this manner, it is possible to reduce the influence of the temperature control of the heater 24 and the Peltier element on the third temperature sensor. As for the third temperature sensor 28, it is possible to use, but not particularly limited to, for example, various well-known temperature sensors such as a thermistor and a thermocouple, similarly to the first temperature sensor 25. Further, the third temperature sensor 28 is electrically coupled to the processing unit 11. Thus, a measurement result in the third temperature sensor 28, that is, information on the temperature of the atom cell 21 is input to the processing unit 11.

As described above, the control circuit 10 includes the bias current adjustment unit 30, the drive circuit 35, the signal generator 40, and the processing unit 11.

The bias current adjustment unit 30 includes the first wave detection circuit 31, the bias generation circuit 32, the first low frequency oscillator 33, and the first error detection circuit 34.

The first low frequency oscillator 33 oscillates at a low frequency of several Hz to several hundred Hz and outputs an oscillation signal to the first wave detection circuit 31 and the bias generation circuit 32.

The first wave detection circuit 31 synchronously detects an output signal of the photodetector element 23 by using a frequency of the oscillation signal outputted from the first low frequency oscillator 33.

The bias generation circuit 32 generates a DC current which is a control current of the light emitting element 22 according to an output of the first error detection circuit 34. In order to enable wave detection by the first wave detection circuit 31, the bias generation circuit 32 superimposes the oscillation signal of the first low frequency oscillator 33 on the generated DC current, and outputs the superimposed signal as a bias current.

The first error detection circuit 34 is a circuit in which a first sweep circuit 341 is incorporated. The first sweep circuit 341 sweeps the center wavelength of the light. In other words, the first sweep circuit 341 sweeps the bias current supplied to the light emitting element 22. Thus, for example, as shown in FIG. 6, when each peak of five absorption lines is designated as a first peak P1, a second peak P2, a third peak P3, a fourth peak P4, and a fifth peak P5 in descending order of a wavelength, the processing unit 11 can detect a peak having the largest peak among these peaks, that is, the peak having the smallest intensity of the light measured by photodetector element 23 as the third peak P3. One "peak" of the absorption line refers to a trajectory of a process in which when the intensity of the light measured by the photodetector element 23 is graphed, the intensity of the light starts to decrease and turns to increase, then the increase stops.

Then, the first error detection circuit 34 stores the value of the bias current in the processing unit 11 when the intensity of the light in the third peak P3 shifts from decrease to increase, that is, when the intensity of the light becomes a minimum. Thus, the bias current is controlled and stabilized. Controlling and stabilizing the bias current is referred to as "lock". Processing from sweeping by the first sweep circuit 341 to locking may be referred to as "first sweep processing".

The drive circuit 35 sets the bias current to be supplied to the light emitting element 22 by finely adjusting the bias current according to an output signal of the bias generation circuit 32, that is, sets the center wavelength of the light emitted from the light emitting element 22. Thus, the central wavelength of the light emitted from the light emitting element 22 is controlled and stabilized by a first feedback loop passing through the light emitting element 22, the atom cell 21, the photodetector element 23, the first wave detection circuit 31, the first error detection circuit 34, the bias generation circuit 32, and the drive circuit 35.

Further, the drive circuit 35 supplies a drive current obtained by superimposing the modulation current on the bias current, to the light emitting element 22. With the modulation current, frequency modulation is applied to the light emitting element 22, and the two sideband lights with the frequencies f1 and f2 along with the light with the center frequency $f_0$ are generated, with the two sideband lights being shifted as much as modulation frequencies +fm and −fm with respect to the center frequency $f_0$, respectively. Then, by a second feedback loop passing through the light emitting element 22, the atom cell 21, the photodetector element 23, the second wave detection circuit 42, the second error detection circuit 47, the voltage controlled oscillator 43, the modulation circuit 44, the PLL 46, and the drive circuit 35, the frequency of the sideband light is controlled so that the sideband lights become a resonance light pair which generates the EIT phenomenon in the alkali metal atom enclosed in the atom cell 21.

The signal generator 40 includes the second wave detection circuit 42, the voltage controlled oscillator 43, the modulation circuit 44, the second low frequency oscillator 45, the PLL 46, and the second error detection circuit 47.

The second wave detection circuit 42 synchronously detects the output signal of the photodetector element 23 at a low frequency by using an oscillation signal of the second low frequency oscillator 45 oscillating at the low frequency of several Hz to several hundred Hz. The oscillation frequency of the second low frequency oscillator 45 is different from the oscillation frequency of the first low frequency oscillator 33. Then, in the voltage controlled oscillator 43, an oscillation frequency of the voltage controlled oscillator 43 is finely adjusted according to a magnitude of an output signal of the second wave detection circuit 42. The voltage controlled oscillator 43 oscillates at a frequency of, for example, 10 MHz.

In order to enable detection by the second wave detection circuit 42, the modulation circuit 44 frequency-modulates the output signal of the voltage controlled oscillator 43 with the oscillation signal of the second low frequency oscillator 45 as a modulation signal.

The phase locked loop (PLL) 46 converts an output signal of the modulation circuit 44 with a constant frequency conversion rate and outputs the converted signal. Thus, the PLL 46 multiplies the output of the modulation circuit 44 and generate a modulation current as a microwave signal. For example, the PLL 46 converts the output signal of the modulation circuit 44 into a signal having a frequency equivalent to ½ of the frequency difference corresponding to the energy difference ΔE of the two ground levels of the alkali metal atom having a magnetic quantum number m=0, which is enclosed in the atom cell 21. The frequency difference is, for example, 9.1926 GHz/2=4.5963 GHz for the cesium atom. Further, the PLL 46 may convert the output signal of the modulation circuit 44 into a signal having a frequency equivalent to the frequency difference corresponding to the energy difference ΔE of the two ground levels of the alkali metal atom having the magnetic quantum number m=0, which is enclosed in the atom cell 21.

The second error detection circuit 47 is a circuit in which a second sweep circuit 471 is incorporated. Similar to the first sweep circuit 341, the second sweep circuit 471 performs sweep processing, that is, the sweep processing of the wavelengths of two sideband lights. This sweep processing may be referred to as "second sweep processing".

The atomic oscillator 1 locks at the center wavelength during drive operation in which the CPT occurs. Then, for example, when a temperature in a vicinity of the atomic oscillator 1, that is, the temperature of the outside air in a use environment of the atomic oscillator 1 increases, the lock of the center wavelength may be released. When the lock of the center wavelength is released, the first sweep processing is performed and the center wavelength is locked again. In the lock, the central absorption line which is the absorption line with the largest peak is locked among the five absorption lines included in an absorption band of the light by the atom cell 21. Further, "the lock is released" means that the value of the bias current already stored in the processing unit 11 at the time of the lock is canceled.

For example, when there are the five absorption lines as shown in FIG. 6, the absorption line having the third peak P3 with the largest peak is locked among these peaks.

However, when the five absorption lines are detected in a state where the temperature of the outside air and the temperature change of the outside air are relatively large, it is sometimes impossible to correctly detect the five absorption lines due to the influence of the temperature of the outside air. Thus, for example, a peak of an absorption line different from an absorption line originally supposed to have the largest peak and to be locked is maximized, and the different absorption line is erroneously detected. In addition, the absorption line which is falsely detected is locked. As a result of locking to the erroneously detected absorption line, the EIT signal deviates from a specified value, and the accuracy of the frequency of the atomic oscillator 1 decreases.

Here, the reason why the "five absorption lines cannot be detected correctly" will be explained.

The temperature of the atom cell 21 is controlled to be kept constant by combining heating by the heater 24 and cooling by the Peltier element 26. An amount of light absorption by the alkali metal atom in the atom cell 21 depends on temperature. Therefore, if the temperature of the atom cell 21 during performing the first sweep processing is constant, the absorption waveform is detected in a correct form.

However, during performing the first sweep processing, for example, when the temperature of the outside air greatly changes in a relatively short time and the temperature of the atom cell 21 changes, the absorption amount of the light by the alkali metal atom changes in the middle of the sweep. When the absorption amount of the light is changed, a waveform may become different from the waveform which is supposed to be obtained when the temperature of the atom cell 21 is constant as described above.

Therefore, the peak which is supposed to be the maximum if the temperature is constant and stable, that is, the peak which should be locked is different from the maximum peak detected in the first sweep processing, and in the atomic oscillator 1, a peak different from the peak which should be originally locked may be determined to be the maximum.

For example, it is assumed that the first peak P1 to the fifth peak P5 are in a state shown in FIG. 7 due to the temperature change during the sweep. Originally, the absorption lines as shown in FIG. 6 are obtained, and the absorption line having the third peak P3 should be locked as described above. In FIG. 7, the first peak P1 which is different from the third peak P3 is the maximum, and the absorption line having the first peak P1 is locked.

The atomic oscillator 1 controls the sweep of the central wavelength of the light based on the temperature of the atom cell 21, thereby reducing an occurrence of a phenomenon of locking to a different absorption line. A specific configuration and operation will be described below.

The processing unit 11 outputs an instruction signal causing the first sweep circuit 341 to perform the first sweep processing and causes the first sweep circuit 341 to sweep. Based on the measurement result of the third temperature sensor 28, the processing unit 11 can change the current supplied from the drive circuit 35 of the current generation circuit 50 to the light emitting element 22 when the change amount of the temperature of the atom cell 21 per unit time is equal to or less than the specified value, and can cause the first sweep circuit 341 of the current generation circuit 50 to perform the sweep of the central wavelength of the light, that is, the first sweep processing.

Further, the processing unit 11 can output an instruction signal causing the second sweep circuit 471 to perform the second sweep processing, and cause the second sweep circuit 471 to sweep.

The processing unit 11 can also output an instruction signal driving the Peltier element 26 based on the measurement result of the second temperature sensor 27 and drive the Peltier element 26.

The configuration of the processing unit 11 may be constituted to include, but not particularly limited to, for example, a central processing unit (CPU) and a memory storing various information such as a program.

Next, a control flow (hereinafter referred to as "first control flow") in which the first sweep processing is performed will be described with reference to the flowchart shown in FIG. 8.

First, in the atomic oscillator 1, the first sweep processing is started by the first error detection circuit 34 and the processing unit 11 in a state in which the atom cell 21 is irradiated with light from the light emitting element 22 (step S101). A program performing the first sweep processing is stored in advance, for example, in a storage of the processing unit 11.

Next, the processing unit 11 determines whether or not the temperature (hereinafter referred to as "temperature $T_{21}$") of the atom cell 21 measured by the third temperature sensor 28 exceeds a first temperature $\alpha_1$ which is a temperature threshold value (step S102).

When it is determined by the processing unit 11 that the temperature $T_{21}$ exceeds the first temperature $\alpha_1$ as a result of the determination in the step S102 (step S102: YES), the processing unit 11 stops the first sweep processing (step S103).

On the other hand, as a result of the determination in the step S102, when the processing unit 11 determines that the temperature 121 does not exceed the first temperature $\alpha_1$ (step S102: NO), the processing unit 11 continues the first sweep processing (step S104). After the step S104 is performed, the process returns to the step S102, and thereafter steps subsequent to the step S102 are sequentially performed.

Further, after the step S103 is performed, the processing unit 11 determines whether or not the change amount (hereinafter referred to as "change amount $\Delta T_{21}$") of the temperature of the atom cell 21 per unit time is equal to or less than a specified value (hereinafter referred to as "threshold change amount $\beta$") which is a threshold value of the change amount (step S105).

As a result of the step S105, when it is determined by the processing unit 11 that change amount $\Delta T_{21}$ is equal to or less than the threshold change amount $\beta$ (step S105: YES), the processing unit 11 determines whether or not the temperature 121 is equal to or lower than a second temperature $\alpha_2$ which is a lower temperature threshold than first temperature $\alpha_1$ (step S106).

As a result of the determination in the step S106, when it is determined by the processing unit 11 that the temperature $T_{21}$ is equal to or less than the second temperature $\alpha_2$ (step S106: YES), the first sweep processing is restarted by the first error detection circuit 34 and the processing unit 11 (step S107). Thus, unless the process goes to the step S107, the first sweep processing is not restarted, and the first sweep processing stops.

Here, the step S107, that is, the restart of the first sweep processing is performed when the determination in the step S105 and the step S106 is positive. On the contrary, when the restart of the first sweep processing is performed in a state in which the determination at the step S105 and the step S106 is negative, that is, the temperature of the outside air and the temperature change of the outside air are relatively large, as described above, an absorption line different from the absorption line which should be originally locked is locked. Therefore, the restart conditions of the first sweep processing are "change amount $\Delta T_{21} \leq$ threshold change amount $\beta$" and "temperature $T_{21} \leq$ second temperature $\alpha_2$". Further, "temperature $T_{21} \leq$ second temperature $\alpha_2$" may be omitted from the restart condition of the first sweep processing.

Then, when the first sweep processing is restarted, a state of the peak of each absorption line is stabilized as in the state shown in FIG. 6, for example. Thus, the processing unit 11 can determine the center wavelength of the light used for generating the frequency signal based on the intensity of the light, that is, can lock the absorption line having the third peak P3 in FIG. 6.

As a result of the determination in the step S105, when the change amount $\Delta T_{21}$ is not equal to or less than the threshold change amount $\beta$, that is, it is determined by the processing unit 11 that the change amount $\Delta T_{21}$ is larger than the threshold change amount $\beta$ (step S105: NO), the processing unit 11 continues to stop the first sweep processing. Then the process returns to the step S105, and thereafter steps subsequent to the step S105 are sequentially performed.

Further, as a result of the determination in the step S106, even when it is determined by the processing unit 11 that the temperature $T_{21}$ is not equal to or less than the second temperature $\alpha_2$ (step S106: NO), the process returns to the step S105, and thereafter steps after the step S105 are sequentially performed.

After the step S107 is performed, the process returns to the step S102, and thereafter steps subsequent to the step S102 are sequentially performed.

As described above, in order to restart after the first sweep processing stops, performing timing of the first sweep processing restart is controlled so that the first sweep processing is performed when the change amount $\Delta T_{21}$ of the temperature of the atom cell 21 is equal to or less than the threshold change amount $\beta$ (specified value) and the temperature $T_{21}$ of the atom cell 21 is equal to or less than the second temperature $\alpha_2$ (specified temperature). Thus, since the first sweep processing can be performed when the temperature change of the atom cell 21 is equal to or less than the specified value, the occurrence of the phenomenon of being locked to the peak which should not be locked can be reduced. Further, by performing the first sweep processing when the temperature $T_{21}$ of the atom cell 21 is equal to or less than the specified temperature, it is possible to reduce deterioration of frequency accuracy due to the temperature of the atom cell 21 being too high. Thus, in the atomic oscillator 1, it is possible to reduce the deterioration of the frequency accuracy of the atomic oscillator 1 due to the temperature change of the outside air.

Further, the first control flow can be applied even when the temperature rises and the lock is released and can be applied even when the temperature drops and the lock is released.

As described above, in the first control flow, when the change amount $\Delta T_{21}$ of the temperature of the atom cell 21 is larger than the threshold change amount $\beta$ (step S105: NO), the first sweep processing is stopped (step S103). Thus, since the first sweep processing is not performed in a period in which the change amount $\Delta T_{21}$ of the temperature is large and a possibility of erroneously measuring the peak at which the absorption amount of the light is the maximum is high, it is possible to prevent the peak different from the peak which should be originally locked from being locked.

Further, by such control, for example, even when the temperature of the atom cell 21 repeatedly fluctuates around the first temperature $\alpha_1$, it is difficult to perform operation such as repeatedly stopping and restarting the first sweep processing. Therefore, the first sweep processing can be restarted under an appropriate temperature condition, and it is easy to stabilize the operation of the atomic oscillator 1.

Further, it is preferable, but not particularly limited to, that the first temperature $\alpha_1$ is, for example, set within a range of 50° C. to 90° C., and more preferably set within a range of 60° C. to 80° C. Further, it is preferable, but not particularly limited to, that the second temperature $\alpha_2$ is, for example, set within a range of 40° C. to 80° C., and more preferably set within a range of 50° C. to 70° C.

Further, the step S105 and the step S106 may be performed at the same time, or the order may be reversed. When the step S105 and the step S106 are performed at the same time, if both steps are YES, the first sweep processing is restarted, and if at least one of the steps is NO, the stop of the first sweep processing is continued.

At the atomic oscillator 1, when performing the first sweeping process, temperature adjustment of the atom cell 21 can be performed by cooling by the Peltier element 26. Further, the first control flow can be applied even when the Peltier element 26 is omitted.

Next, a control flow (hereinafter referred to as "second control flow") for also operating the Peltier element 26 along with performing the first sweep processing will be described with reference to the flowchart shown in FIG. 9.

First, in the atomic oscillator 1, the first sweep processing is started by the first error detection circuit 34 and the processing unit 11 in a state in which the atom cell 21 is irradiated with light from the light emitting element 22 (step S201).

Next, operation of the Peltier element 26 is permitted, and if necessary, temperature adjustment is performed (step S202). Further, the step S201 and the step S202 may be performed simultaneously, or the order may be reversed.

Next, the processing unit 11 determines whether or not the temperature 121 of the atom cell 21 measured by the third temperature sensor 28 exceeds the first temperature $\alpha_1$ (step S203).

As a result of the determination in the step S203, when the processing unit 11 determines that the temperature 121 exceeds the first temperature $\alpha_1$ (step S203: YES), the processing unit 11 stops the first sweep processing (step S204). After the step S204 is performed, the cooling of the Peltier element 26 is stopped without allowing the operation of the Peltier element 26 (step S205). Further, the step S204 and the step S205 may be performed simultaneously, or the order may be reversed.

On the other hand, as a result of the determination in the step S203, when it is determined by the processing unit 11 that the temperature $T_{21}$ does not exceed the first temperature $\alpha_1$ (step S203: NO), the process returns to the step S203, and thereafter steps subsequent to the step S203 are sequentially performed.

After performing the step S205, the processing unit 11 determines whether or not the change amount $\Delta T_{21}$ is equal to or less than the threshold change amount $\beta$ (step S206).

As a result of the determination in the step S206, when the processing unit 11 determines that the change amount $\Delta T_{21}$ is equal to or less than the threshold change amount $\beta$ (step S206: YES), the processing unit 11 determines whether or not the temperature 121 is equal to or less than the second temperature $\alpha_2$ (step S207).

As a result of the determination in the step S207, when it is determined by the processing unit 11 that the temperature 121 is equal to or less than the second temperature $\alpha_2$ (step S207: YES), the first sweep processing is restarted by the first error detection circuit 34 and the processing unit 11 (step S208).

Next, the operation of the Peltier element 26 is permitted, and if necessary, the temperature adjustment is performed (step S209). Further, the step S208 and the step S209 may be performed simultaneously, or the order may be reversed.

Further, as a result of the determination in the step S206, when it is determined by the processing unit 11 that the change amount $\Delta T_{21}$ is not equal to or less than the threshold change amount $\beta$ (step S206: NO), the process returns to the step S206, and thereafter steps after the step S206 are sequentially performed.

Further, as a result of the determination in the step S207, even when it is determined by the processing unit 11 that the temperature 121 is not equal to or less than the second temperature $\alpha_2$ (step S207: NO), the process returns to the step S206, and thereafter steps after the step S206 are sequentially performed.

After the step S209 is performed, the process returns to the step S203, and thereafter steps subsequent to the step S203 are sequentially performed.

By such second control flow, the temperature adjustment by the Peltier element 26 can be performed when the first sweep processing is performed. Thus, if there is a state in which the first sweep processing is performed, the state of performing the first sweep processing can be maintained as much as possible. Further, even when the temperature of the outside air and the temperature change of the outside air become relatively large and the first sweep processing is stopped, the first sweep processing can be quickly restarted by the temperature adjustment in the Peltier element 26.

Further, the step S206 and the step S207 may be performed at the same time, or the order may be reversed. When the step S206 and the step S207 are performed at the same time, if both steps are YES, the first sweep processing is restarted, and if at least one of the steps is NO, the stop of the first sweep processing is continued.

The atomic oscillator 1 as described above can be incorporated into various electronic apparatus. Hereinafter, an embodiment of a frequency signal generation system including an electronic apparatus will be described.

Figure 10:
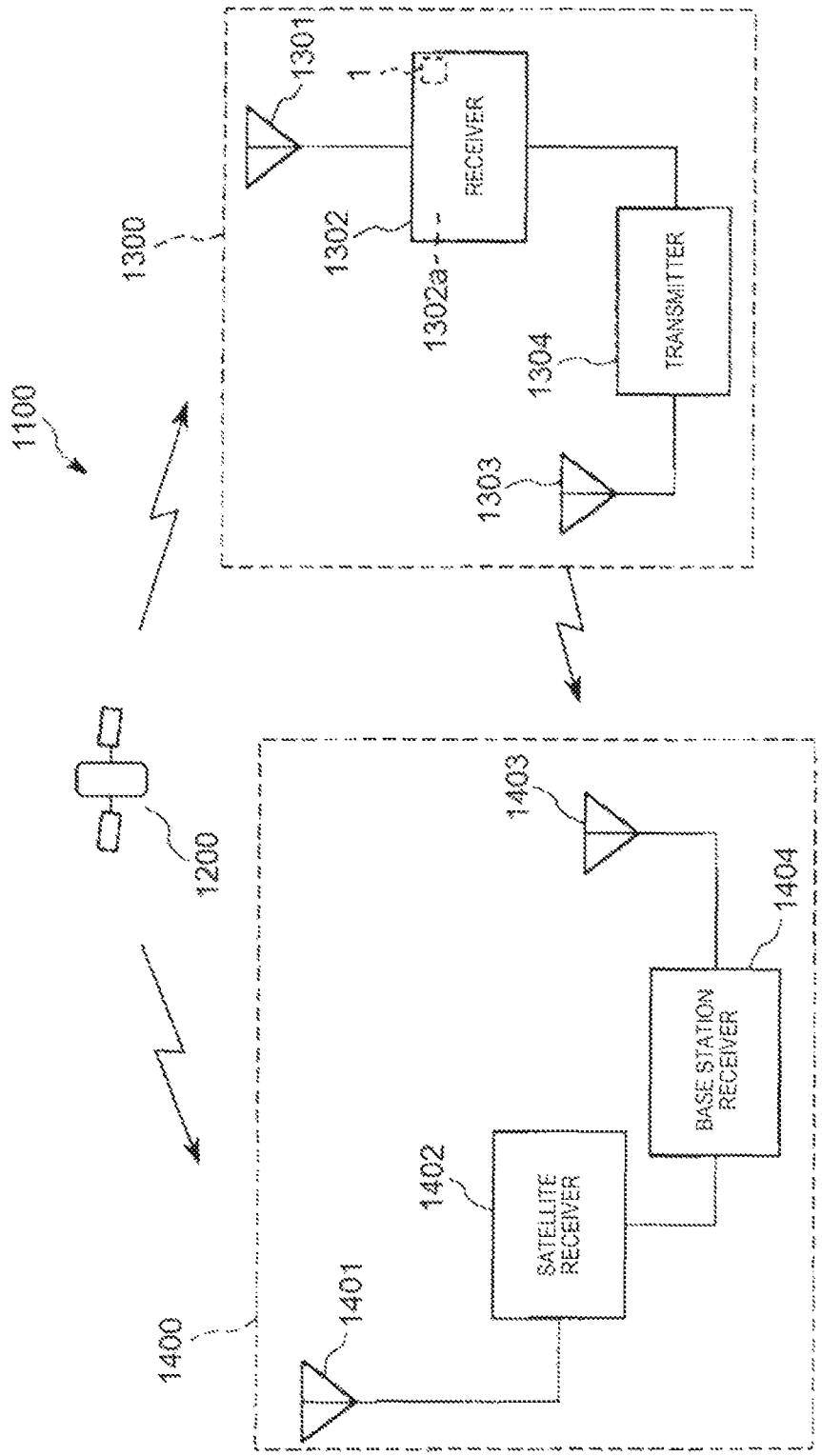
FIG. 10 is a diagram illustrating a schematic configuration of a positioning system using a global positioning system (GPS) satellite, which is an example of a frequency signal generation system.

FIG. 10 is a diagram illustrating a schematic configuration of a positioning system using a global positioning system (GPS) satellite, which is an example of the frequency signal generation system.

A positioning system 1100, which is the example of the frequency signal generation system shown in FIG. 10, is constituted with a GPS satellite 1200, a base station device 1300, and a GPS receiver 1400.

The GPS satellite 1200 transmits a GPS signal as positioning information.

The base station device 1300 includes a receiver 1302 which highly accurately receives the positioning information from the GPS satellite 1200 via an antenna 1301 installed in a GPS continuous observation station as an electronic reference point, and a transmitter 1304 which transmits the positioning information received by the receiver 1302 via an antenna 1303.

Here, the receiver 1302 includes the atomic oscillator 1 which is a reference frequency oscillation source and a signal processing unit 1302a which processes a signal from the atomic oscillator 1. In addition, the positioning information received by the receiver 1302 is transmitted by the transmitter 1304 in real time. Thus, the receiver 1302 which is an electronic apparatus includes the atomic oscillator 1. According to such receiver 1302, it is possible to improve a characteristic of the receiver 1302 by using an effect of the atomic oscillator 1. For example, since an individual difference of the characteristic of the atomic oscillator 1 is small, a yield of the atomic oscillator 1 can be increased to lower cost of the atomic oscillator 1, and furthermore, cost of the receiver 1302 can be reduced.

A GPS receiver 1400 includes a satellite receiver 1402 receiving the positioning information from the GPS satellite 1200 via an antenna 1401 and a base station receiver 1404 receiving the positioning information from the base station device 1300 via an antenna 1403.

As described above, the receiver 1302 of a positioning system 1100 includes the atomic oscillator 1 which is the reference frequency oscillation source and the signal processing unit 1302a which processes the signal from the atomic oscillator 1. The positioning system 1100 is an example of a frequency signal generation system. According to such positioning system 1100, it is possible to improve a characteristic of the positioning system 1100 by using the effect of the atomic oscillator 1 described above.

As described above, the atomic oscillator 1 includes the atom cell 21 containing the alkali metal atom, the light emitting element 22 irradiating the atom cell 21 with the light, the photodetector element 23 measuring the intensity of the light transmitted through the atom cell 21, the third temperature sensor 28 measuring the temperature of the atom cell 21, the current generation circuit 50 generating current for controlling the light emitting element 22 based on the intensity of the light, and the processing unit 11 sweeping the center wavelength of the light by changing the current, which is supplied from the current generation circuit 50 to the light emitting element 22, in the current generation circuit 50 when the change amount of the temperature per unit time is equal to or less than the specified value. The processing unit 11 can determine the center wavelength of the light used for generating the frequency signal based on the intensity of the light.

Further, the frequency signal generation system may be applied to, but not limited to the above-described one, for example, a smartphone, a tablet terminal, a timepiece, a mobile phone, a digital still camera, an ink jet type ejecting apparatus such as an ink jet printer, a personal computer such as a mobile type personal computer, a laptop type personal computer, a television, a video camera, a video tape recorder, a car navigation device, a pager, an electronic notebook, an electronic dictionary, a calculator, an electronic game apparatus, a word processor, a workstation, a video telephone, a crime prevention TV monitor, an electronic binoculars, a point of sales (POS) terminal, a medical apparatus such as an electronic thermometer, a blood pressure monitor, a blood glucose meter, an electrocardiogram measurement device, an ultrasonic diagnostic device, an electronic endoscope, a fish detection instrument, various measuring apparatus, measuring instruments such as measuring instruments of a vehicle, an aircraft, and a ship, a flight simulator, terrestrial digital broadcasting, a mobile phone base station, or the like. Further, the frequency signal generation system may be any system if the frequency signal generation system processes a signal from the atomic oscillator 1 to generate a signal, and may be, but not limited to the described above, for example, a clock transmission system or the like. The frequency signal generation system includes a terminal to which the frequency signal from the atomic oscillator 1 is inputted and a control unit which controls the atomic oscillator 1.

Although the method of controlling the atomic oscillator, the atomic oscillator, and the frequency signal generation system according to the present disclosure have been described based on the illustrated embodiments, the present disclosure is not limited thereto.

Further, a constitution of each unit according to the present disclosure can be replaced by an arbitrary constitution exhibiting the same function of the above-described embodiment, and an arbitrary constitution and process can be added.

Further, in the above-described embodiment, although the first sweep processing, that is, the sweep of the center wavelength (center frequency), and the sweep of the second sweep processing, that is, the sweep of the wavelengths (frequencies) of the two sideband lights are performed in the same process, the present disclosure is not limited thereto, and for example, the first sweep processing may be performed first and the second sweep processing may be performed later.

Further, in the above-described embodiment, when the control based on the temperature change is stopped, and the change amount of the temperature per unit time is larger than the specified amount or the temperature is higher than the specified temperature, notification regarding reliability of the frequency signal may be performed. As a specific example, performing notification regarding the change amount of the temperature per unit time and the temperature, performing notification regarding a possibility that accuracy of the frequency signal is deteriorated, or the like can be cited, for example.

Further, in the above-described embodiment, a cooling element such as the Peltier element may be omitted, and cooling control may not be performed.

Further, in the above-described embodiment, although a case in which the present disclosure is applied to the atomic oscillator using the CPT is described as an example, the present disclosure is not limited thereto and may also be applied to the atomic oscillator using the double resonance phenomenon. When the present disclosure is applied to the atomic oscillator using the double resonance phenomenon, the light source is not limited to a semiconductor laser, and for example, a light emitting diode, a lamp enclosing an alkali metal atom, or the like can be used.

Further, various circuits in the above-described embodiments may be analog circuits or digital circuits.

In the above-described embodiment, although the third temperature sensor 28 directly measures the temperature of the atom cell, the third temperature sensor 28 is not limited thereto and may measure a temperature of a portion corresponding to the temperature of the atom cell.

What is claimed is:

1. A method of controlling an atomic oscillator comprising:
    irradiating an atom cell containing an alkali metal atom with light;
    measuring a temperature of the atom cell;
    sweeping a center wavelength of the light when a change amount of the temperature per unit time is equal to or less than a specified value;
    measuring an intensity of light passing through the atom cell; and
    determining the center wavelength of the light used for generating a frequency signal based on the intensity of the light,
    wherein the sweeping is stopped when the temperature rises to exceed a first temperature.

2. The method of controlling an atomic oscillator according to claim 1, wherein
    the sweeping is performed when the change amount of the temperature is equal to or less than the specified value and the temperature is equal to or less than a specified temperature.

3. The method of controlling an atomic oscillator according to claim 1, wherein
    the sweeping is started when the temperature decreases to be equal to or less than a second temperature lower than the first temperature.

4. The method of controlling an atomic oscillator according to claim 1, wherein
    the sweeping is stopped when the change amount of the temperature is larger than the specified value.

5. An atomic oscillator comprising:
    an atom cell that contains an alkali metal atom;
    a light emitting element that irradiates the atom cell with light;
    a photodetector element that measures an intensity of light transmitted through the atom cell;
    a temperature sensor that measures a temperature of the atom cell;
    a circuit that generates a current for controlling the light emitting element based on the intensity of the light; and
    a processing unit that
        causes the circuit to change the current thereby sweeping a center wavelength of the light when a change amount of the temperature per unit time is equal to or less than a specified value, and
        determines the center wavelength of the light used for generating a frequency signal based on the intensity of the light,
    wherein the sweeping is stopped when the temperature rises to exceed a first temperature.

6. A frequency signal generation system comprising:
    an atomic oscillator including:
        an atom cell that contains an alkali metal atom,
        a light emitting element that irradiates the atom cell with light,
        a photodetector element that measures an intensity of light transmitted through the atom cell,
        a temperature sensor that measures a temperature of the atom cell,
        a circuit that generates a current for controlling the light emitting element based on the intensity of the light, and
        a processing unit that
            causes the circuit to change the current thereby sweeping a center wavelength of the light when a change amount of the temperature per unit time is equal to or less than a specified value, and
            determines the center wavelength of the light used for generating a frequency signal based on the intensity of the light; and
    a signal processing unit that processes a signal from the atomic oscillator,
    wherein the sweeping is stopped when the temperature rises to exceed a first temperature.

* * * * *